(12) United States Patent (10) Patent No.: US 12,660,504 B2
Ito et al. (45) Date of Patent: Jun. 16, 2026

(54) VIBRATION GENERATING DEVICE FOR PRESENTING HAPTIC SENSATION USING PIEZOELECTRIC ACTUATOR AND ELECTRONIC APPARATUS USING SAME

(71) Applicant: TAIYO YUDEN CO., LTD., Tokyo (JP)

(72) Inventors: Fumihisa Ito, Takasaki (JP); Yukihiro Matsui, Takasaki (JP); Hiroshi Hamada, Takasaki (JP)

(73) Assignee: TAIYO YUDEN CO., LTD., Tokyo (JP)

(*) Notice: Subject to any disclaimer, the term of this patent is extended or adjusted under 35 U.S.C. 154(b) by 903 days.

(21) Appl. No.: 17/801,945

(22) PCT Filed: Mar. 1, 2021

(86) PCT No.: PCT/JP2021/007637
§ 371 (c)(1),
(2) Date: Aug. 24, 2022

(87) PCT Pub. No.: WO2021/177211
PCT Pub. Date: Sep. 10, 2021

(65) Prior Publication Data
US 2023/0095671 A1 Mar. 30, 2023

(30) Foreign Application Priority Data

Mar. 5, 2020 (JP) ................................. 2020-037755
Mar. 5, 2020 (JP) ................................. 2020-038007

(51) Int. Cl.
*H10N 30/20* (2023.01)
*B06B 1/06* (2006.01)
(Continued)

(52) U.S. Cl.
CPC ........... *H10N 30/20* (2023.02); *B06B 1/0648* (2013.01); *H10N 30/85* (2023.02); *H10N 30/872* (2023.02)

(58) Field of Classification Search
CPC ...... H10N 30/20; H10N 30/85; H10N 30/872; H10N 30/073; B06B 1/0648; B06B 2201/55
See application file for complete search history.

(56) References Cited

U.S. PATENT DOCUMENTS 7,085,484 B2 * 8/2006 Hara ...................... H02N 2/067
310/316.02
2005/0220614 A1 10/2005 Tsuzuki et al.
(Continued)

FOREIGN PATENT DOCUMENTS

CN 104012115 A 8/2014
CN 106537301 A 3/2017
(Continued)

OTHER PUBLICATIONS

A Notice of Reasons for Refusal issued by the Japanese Patent Office, mailed Apr. 30, 2024, for Japanese counterpart application No. 2020-038007. (3 pages).
(Continued)

*Primary Examiner* — Emily P Pham
(74) *Attorney, Agent, or Firm* — Law Office of Katsuhiro Arai

(57) ABSTRACT

A vibration generating device includes: a vibrator; and a piezoelectric actuator. The vibrator has a first main surface and a second main surface on a side opposite to the first main surface. The piezoelectric actuator is joined to the second main surface. A plurality of recessions and projections is formed at equal intervals on the first main surface. The vibration generating device is configured to be capable of
(Continued)

presenting a haptic sensation while preventing a contact sound from being generated.

11 Claims, 11 Drawing Sheets

(51) Int. Cl.
    *H10N 30/85*         (2023.01)
    *H10N 30/87*         (2023.01)

(56)            References Cited

U.S. PATENT DOCUMENTS

| | | | |
|---|---|---|---|
| 2010/0225596 A1* | 9/2010 | Eldering | G06F 3/0436 |
| | | | 345/173 |
| 2013/0285967 A1 | 10/2013 | Kitatani et al. | |
| 2015/0003642 A1 | 1/2015 | Nakamura | |
| 2016/0004387 A1* | 1/2016 | Shimizu | G06F 3/0428 |
| | | | 345/175 |
| 2016/0209923 A1 | 7/2016 | Miyamoto et al. | |
| 2016/0293827 A1* | 10/2016 | Otsuki | H03H 9/0547 |
| 2017/0083099 A1 | 3/2017 | Hashimoto | |
| 2019/0084005 A1 | 3/2019 | Tsang et al. | |
| 2019/0267535 A1* | 8/2019 | Hamada | H10N 30/872 |
| 2019/0287919 A1 | 9/2019 | Sano | |
| 2019/0354185 A1 | 11/2019 | Vezzoli et al. | |
| 2020/0059733 A1 | 2/2020 | Shin et al. | |
| 2021/0181850 A1* | 6/2021 | Rosenberg | G06F 3/04886 |

FOREIGN PATENT DOCUMENTS

| | | | |
|---|---|---|---|
| CN | 110854262 | A | 2/2020 |
| JP | 2001255993 | A | 9/2001 |
| JP | 2003334396 | A | 11/2003 |
| JP | 2005291149 | A | 10/2005 |
| JP | 2012155526 | B | 8/2012 |
| JP | 2018194967 | A | 12/2018 |
| JP | 2019016111 | A | 1/2019 |
| JP | 2019161113 | A | 9/2019 |
| JP | 2020504892 | A | 2/2020 |
| WO | 2018139217 | A1 | 8/2018 |

OTHER PUBLICATIONS

International Search Report (ISR) mailed Apr. 27, 2021, issued for International application No. PCT/JP2021/007637. (2 pages).

A Notice of Reasons for Refusal issued by the Japanese Patent Office, mailed Dec. 26, 2023, for Japanese counterpart application No. 2020-038007. (2 pages).

A First Office Action with Search Report issued by the State Intellectual Property Office of the People's Republic of China on Dec. 8, 2025, for Chinese counterpart application No. 202180019017.X (8 pages).

A Second Office Action with Search Report issued by the State Intellectual Property Office of the People's Republic of China on Apr. 18, 2026, for Chinese counterpart application No. 202180019017.X (7 pages).

* cited by examiner

VIBRATION GENERATING DEVICE FOR PRESENTING HAPTIC SENSATION USING PIEZOELECTRIC ACTUATOR AND ELECTRONIC APPARATUS USING SAME

CROSS-REFERENCE TO RELATED APPLICATIONS

This application is the U.S. National Phase under 35 U.S.C. § 371 of International Application PCT/JP2021/ 007637, filed Mar. 1, 2021, which claims priority to Japanese Patent Application No. JP2020-037755, filed Mar. 5, 2020 and No. 2020-038007, filed Mar. 5, 2020. The International Application was published under PCT Article 21 (2) in a language other than English.

TECHNICAL FIELD

The present invention relates to a vibration generating device and an electronic apparatus relating to haptic presentation by vibration.

BACKGROUND ART

A touch panel of a smartphone, car navigation, or the like uses a technology (force feedback) for notifying, by vibration, that an input has been made. Further, in recent years, a haptic sensation technology for not only notifying but also expressing the feel of a displayed object and making an operation position recognizable by giving various variations to the vibration of the panel has been studied.

As a haptic sensation technology, a standing wave can be generated on the surface of a panel by attaching a piezoelectric actuator to the panel and generating a vibration in an ultrasonic band. When a user touches the surface with his/her finger or the like, he/she can feel a haptic sensation. Then, by changing the signal pattern, it is possible to express various variations of haptic sensations.

However, when the panel surface that generates such a haptic sensation is touched with a finger, an abnormal sound due to contact between the finger and the panel (hereinafter, a contact sound) is generated in some cases. Meanwhile, Patent Literature 1 proposes a method of making a contact sound of a finger auditorily quieter by the two-tone suppression effect by generating, with respect to a generated sound, a suppression sound of a frequency higher than the frequency of the generated sound. Further, Patent Literature 2 presents a method of reducing a contact sound of a finger by making the surface roughness of the panel surface rougher.

CITATION LIST

Patent Literature

Patent Literature 1: Japanese Patent Application Laid-open No. 2018-194967
Patent Literature 2: Japanese Patent Application Laid-open No. 2019-16111

DISCLOSURE OF INVENTION

Technical Problem

However, in the technology described in Patent Literature 1, the generation of a contact sound itself is not suppressed.

Further, in the technology described in Patent Literature 2, the continuity of recessions and projections of the surface is not mentioned.

In view of the circumstances as described above, it is an object of the present invention to provide a vibration generating device and an electronic apparatus that are capable of presenting a haptic sensation while preventing a contact sound from being generated.

Solution to Problem

In order to achieve the above-mentioned object, a vibration generating device according to an embodiment of the present invention includes: a vibrator; and a piezoelectric actuator.

The vibrator has a first main surface and a second main surface on a side opposite to the first main surface.

The piezoelectric actuator is joined to the second main surface.

A plurality of recessions and projections is formed at equal intervals on the first main surface.

In accordance with this configuration, since recessions and projections are formed at equal intervals on a first main surface of a vibrator, the contact between a finger of a user who touches the first main surface and the first main surface does not continue and it is possible to prevent a contact sound from being generated while presenting a haptic sensation to the finer of the user.

The plurality of recessions and projections may have a depth of 0.01 mm or more and 0.1 mm or less and a width of 1 mm or more and 10 mm or less.

The plurality of recessions and projections may include a plurality of recessed portions that extends in a first direction parallel to the first main surface and a plurality of projecting portions that extends in the first direction, the plurality of recessed portions and the plurality of projecting portions including a recessed portion and a projecting portion alternately formed.

The plurality of recessions and projections may further include a plurality of recessed portions that extends in a second direction and a plurality of projecting portions that extends in the second direction, the plurality of recessed portions and the plurality of projecting portions including a recessed portion and a projecting portion alternately formed, the second direction being parallel to the first main surface and different from the first direction.

The plurality of recessions and projections may have a cross-sectional shape of a sine-wave shape on a plane perpendicular to the first direction.

The vibrator may be formed of glass or a resin material having a flexural modulus of 3.0 GPa or more.

The vibrator may include a base material and a film attached to a surface of the base material, and the recessions and projections may be formed on a surface of the film.

The vibrator may have optical transparency.

In order to achieve the above-mentioned object, an electronic apparatus according to an embodiment of the present invention includes: a vibration generating device.

The vibration generating device includes a vibrator that has a first main surface and a second main surface on a side opposite to the first main surface, and a piezoelectric actuator joined to the second main surface, in which a plurality of recessions and projections is formed at equal intervals on the first main surface.

In order to achieve the above-mentioned object, a vibration generating device according to an embodiment of the present invention includes: a vibrator; a piezoelectric actuator; and a drive device.

The vibrator has a first main surface and a second main surface on a side opposite to the first main surface.

The piezoelectric actuator is joined to the second main surface.

The drive device supplies a drive signal of a frequency of 60 kHz or more to the piezoelectric actuator.

With this configuration, since the vibration of a ¼ frequency that causes a contact sound by a finger and a vibrator is a vibration of 15 kHz or more and exceeds the audible band of humans, it is possible to prevent a contact sound from being generated.

The vibrator may be formed of glass or a resin material having a flexural modulus of 3.0 GPa or less.

In order to achieve the above-mentioned object, an electronic apparatus according to an embodiment of the present invention includes: a vibration generating device.

The vibration generating device includes a vibrator that has a first main surface and a second main surface on a side opposite to the first main surface, a piezoelectric actuator that is joined to the second main surface, and a drive device that supplies a drive signal of a frequency of 60 kHz or more to the piezoelectric actuator.

The vibration generating device may further include a drive device that supplies a drive signal of a frequency of 60 kHz or more to the piezoelectric actuator.

Advantageous Effects of Invention

As described above, in accordance with the present invention, it is possible to provide a vibration generating device and an electronic apparatus that are capable of presenting a haptic sensation while preventing a contact sound from being generated.

4

Figure 13:
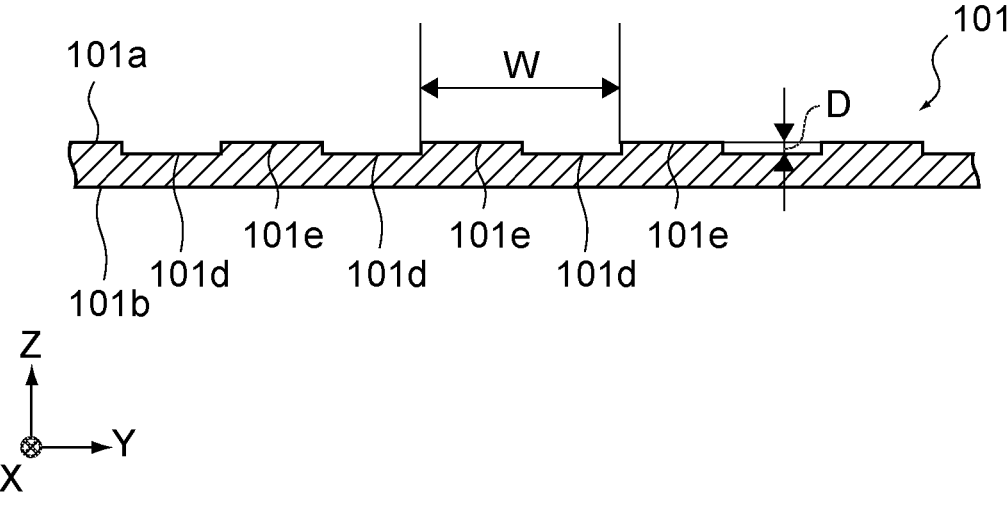

FIG. 13 is a side view of the vibrator having another configuration according to the embodiment of the present invention.

Figure 14:
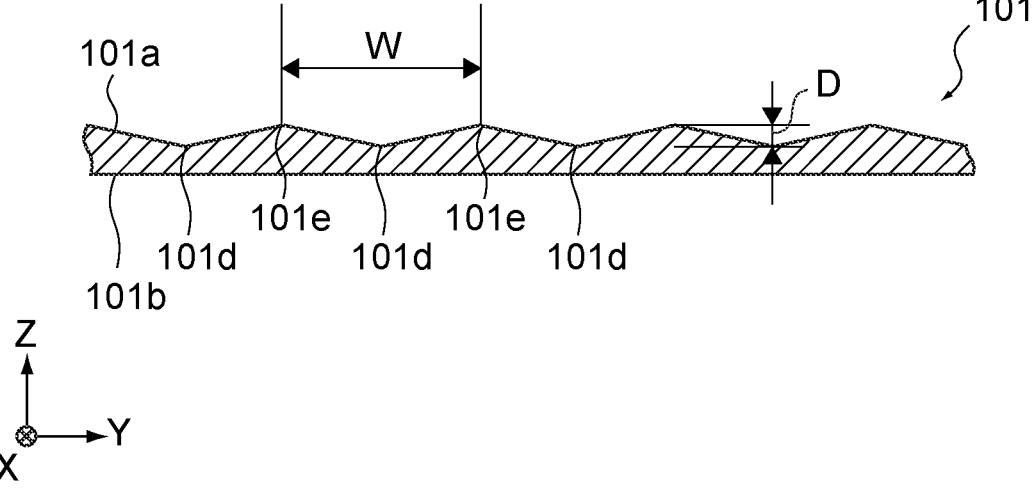

FIG. 14 is a side view of the vibrator having another configuration according to the embodiment of the present invention.

Figure 15:
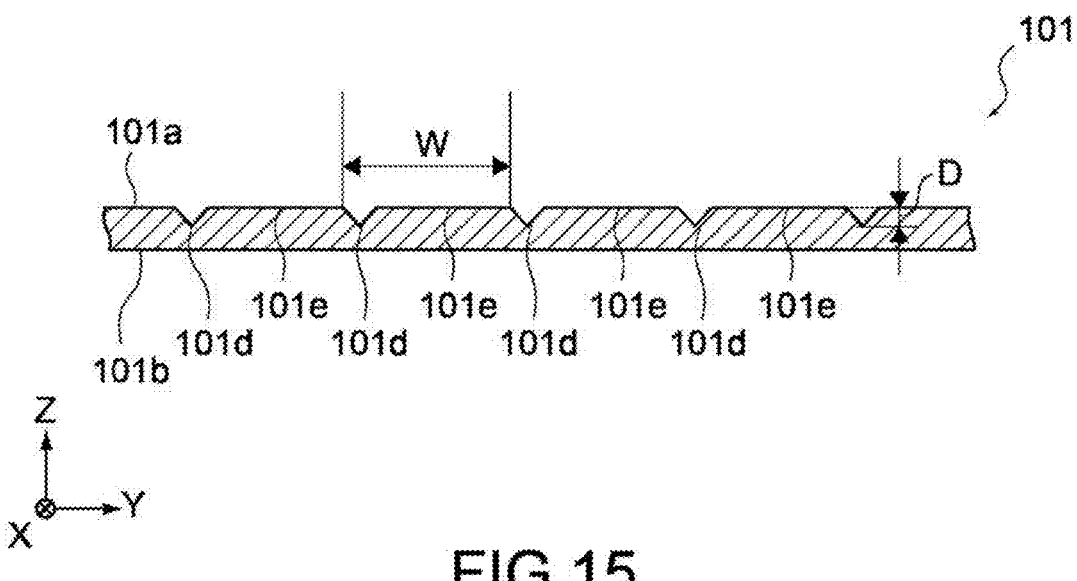

FIG. 15 is a side view of the vibrator having another configuration according to the embodiment of the present invention.

Figure 16:
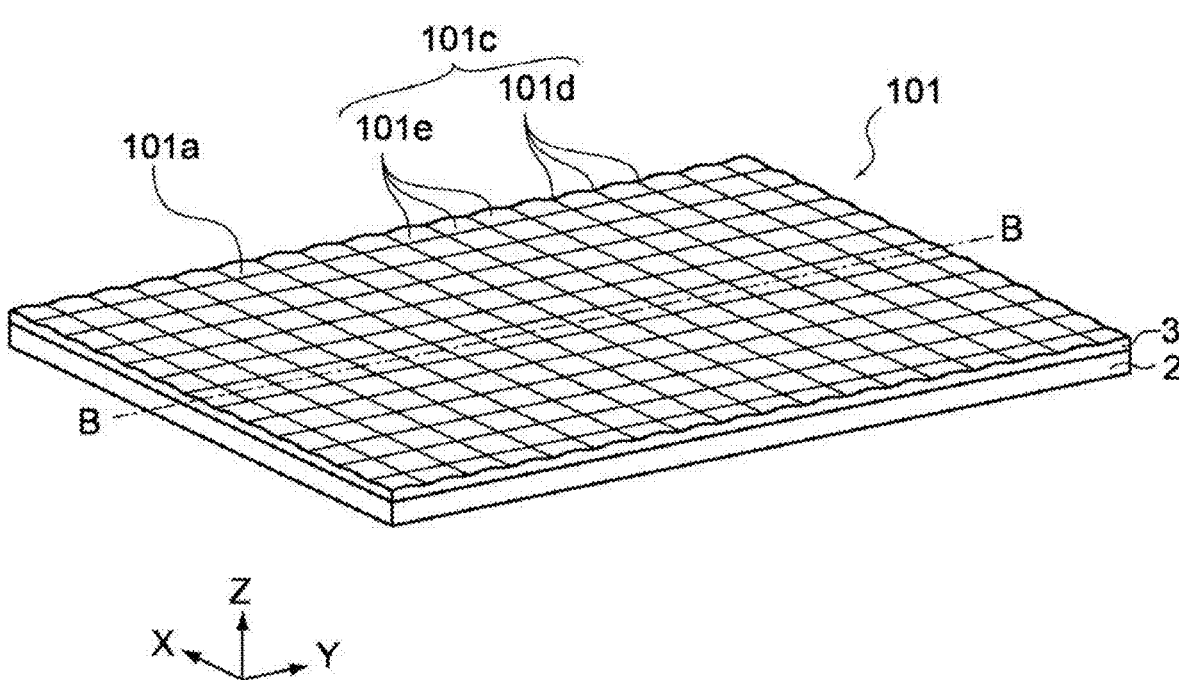

FIG. 16 is a perspective view of the vibrator in which recessions and projections are provided along two directions according to the embodiment of the present invention.

Figure 17:
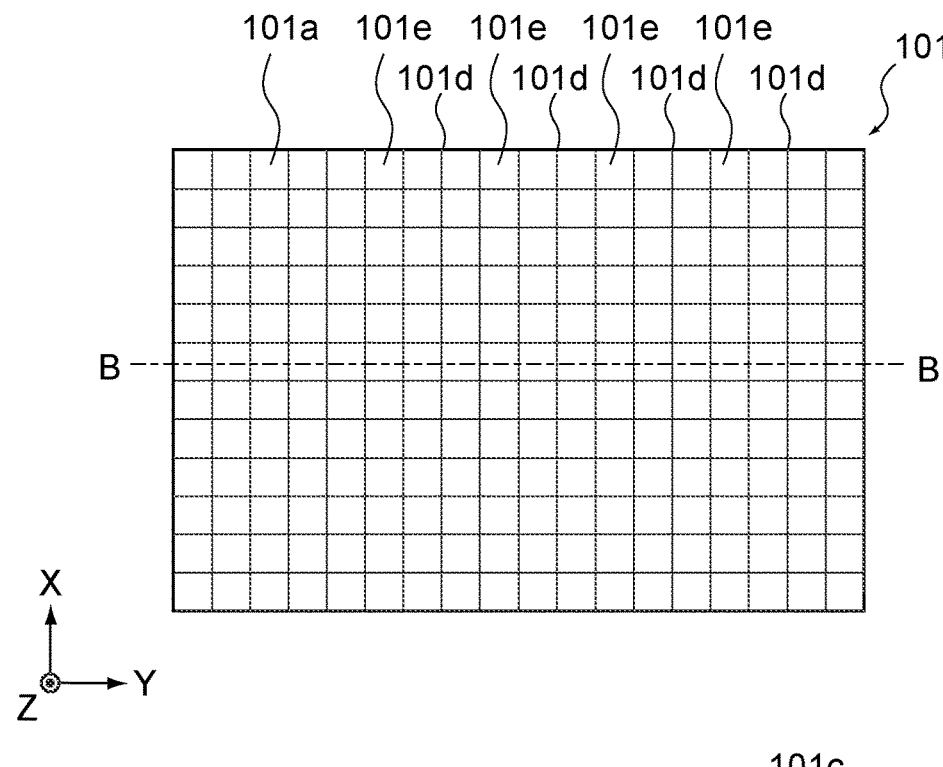

FIG. 17 is a plan view of the vibrator.

Figure 18:
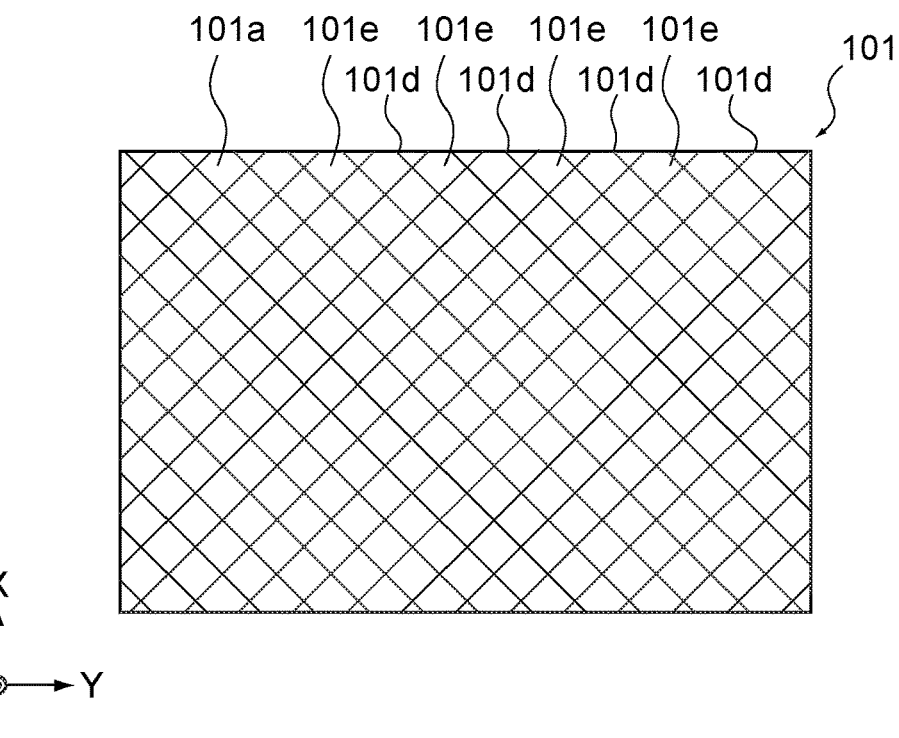

FIG. 18 is a plan view of the vibrator having another configuration according to the embodiment of the present invention.

Figure 19:
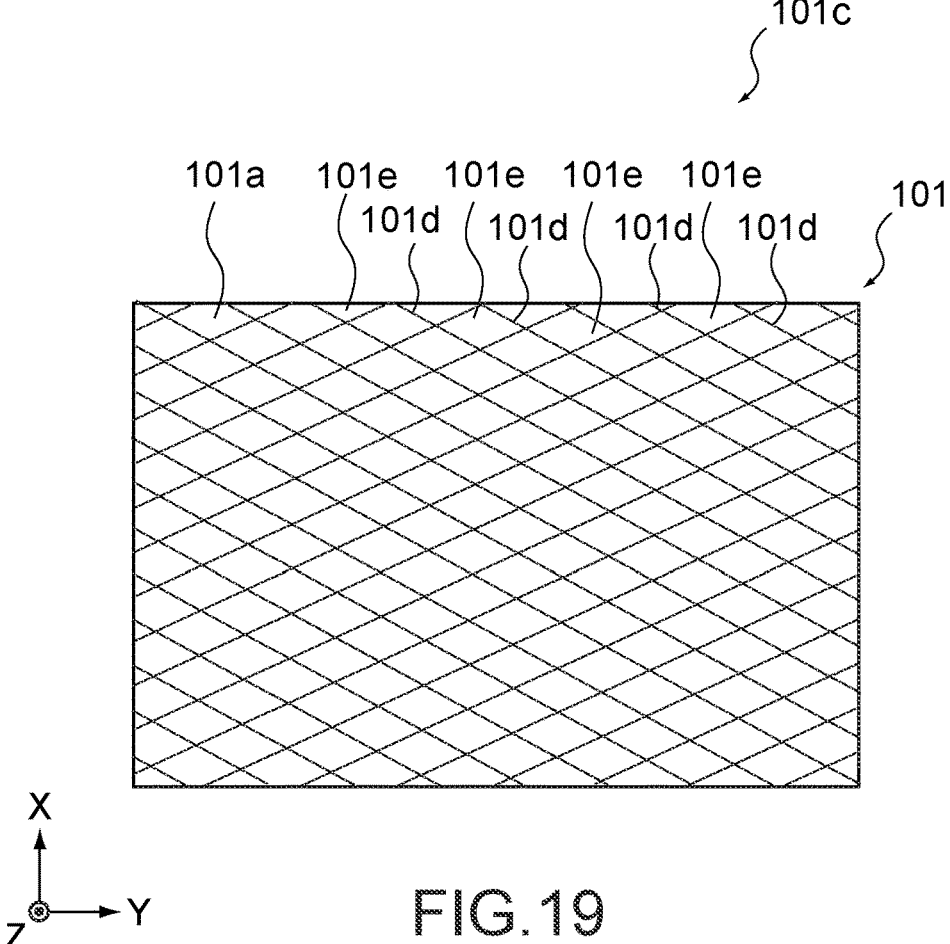

FIG. 19 is a plan view of the vibrator having another configuration according to the embodiment of the present invention.

Figure 20:
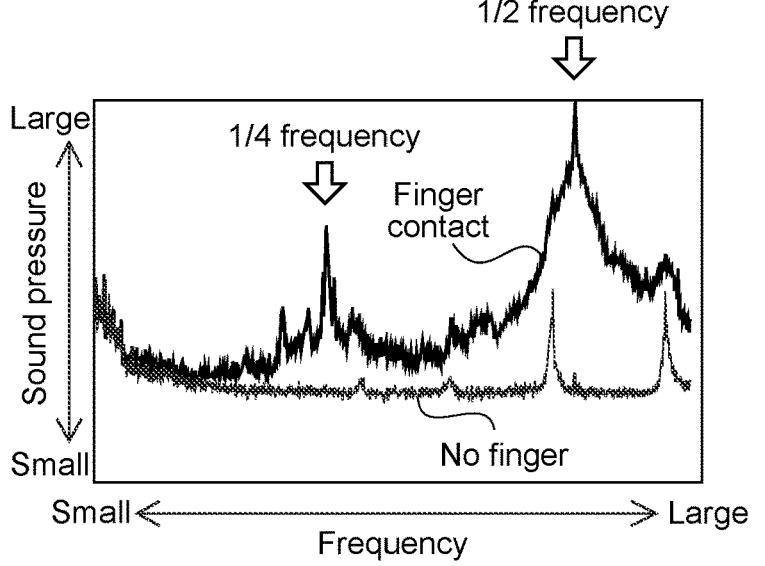

FIG. 20 is a graph showing the sound pressure characteristics of the vibrator included in the vibration generating device according to the embodiment of the present invention.

Figure 21:
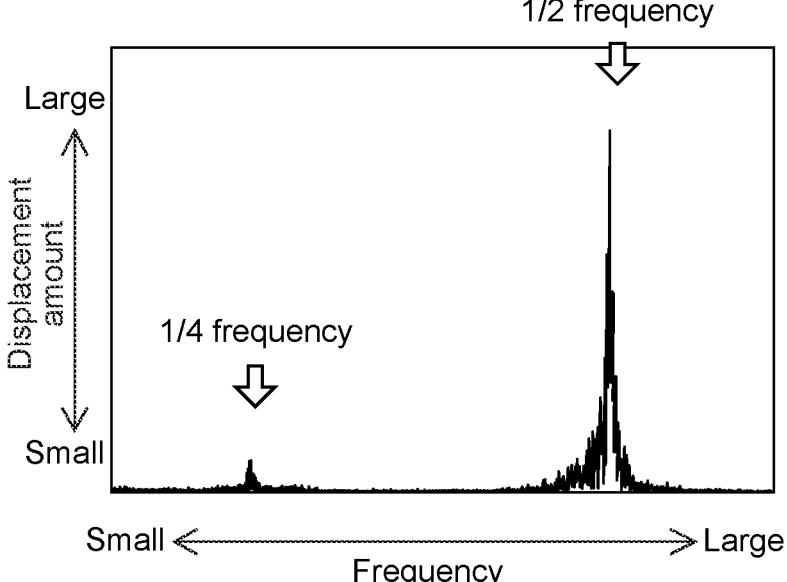

FIG. 21 is a graph showing the vibration displacement amount of the vibrator.

MODE(S) FOR CARRYING OUT THE INVENTION

A vibration generating device according to an embodiment of the present invention will be described. Note that in each of the drawings below, the X direction, the Y direction, and the Z direction are three directions orthogonal to each other.

[Configuration of Vibration Generating Device]

Figure 1:
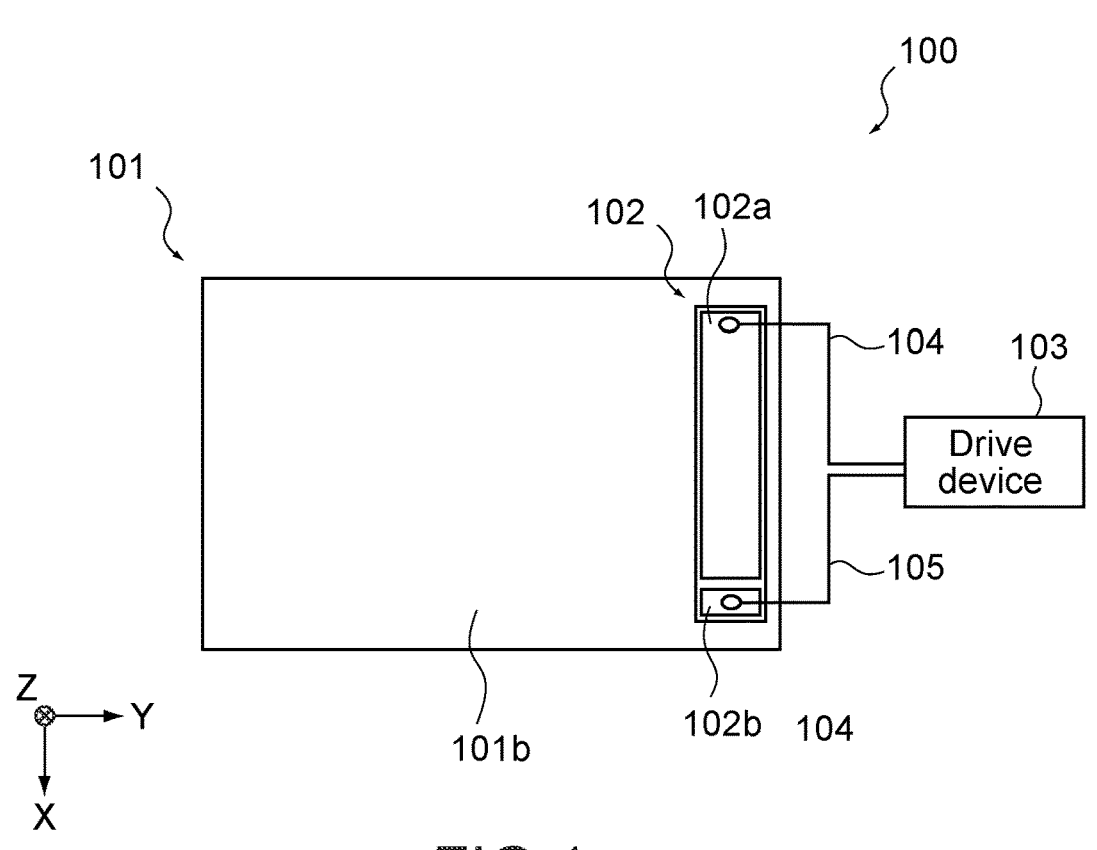
FIG. 1 is a schematic diagram showing a vibration generating device according to an embodiment of the present invention.
Figure 2:
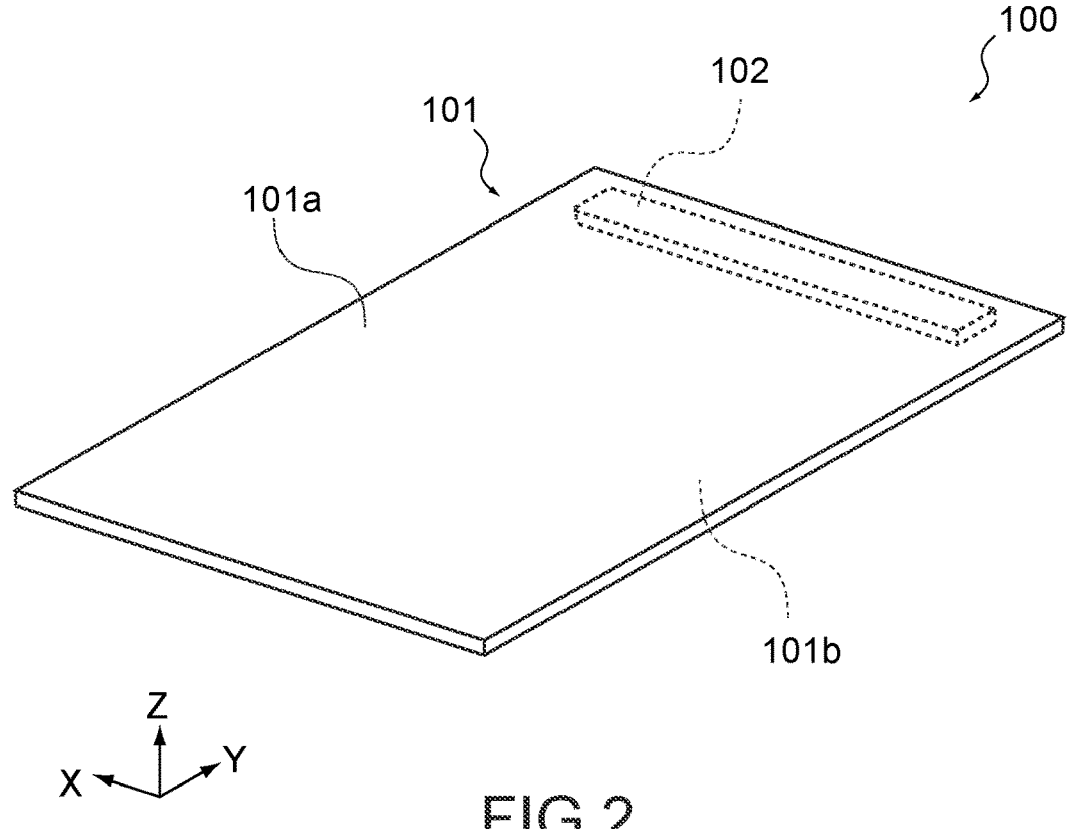
FIG. 2 is a perspective view of the vibration generating device.
Figure 3:
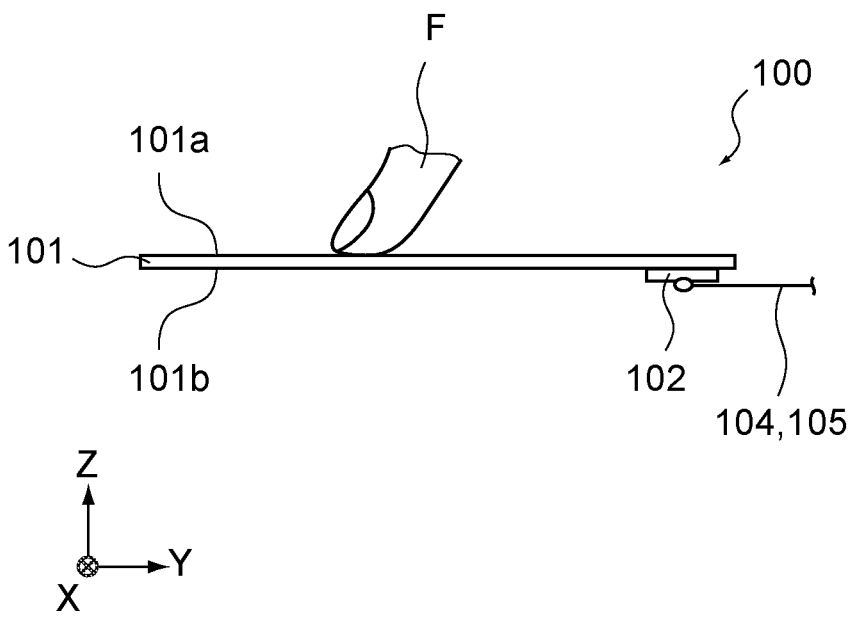
FIG. 3 is a side view of the vibration generating device.

FIG. 1 is a schematic diagram showing a vibration generating device 100 according to this embodiment. As shown in the figure, the vibration generating device 100 includes a vibrator 101, a piezoelectric actuator 102, and a drive device 103. FIG. 2 is a perspective view of the vibration generating device 100, and FIG. 3 is a side view of the vibration generating device 100. Note that illustration of the drive device 103 is omitted in FIG. 2 and FIG. 3.

The vibrator 101 presents a haptic sensation to a user who touches the vibrator 101. The vibrator 101 can be a plate-shaped member formed of glass or a resin material and includes, for example, a liquid crystal panel or a casing of an electronic apparatus. In the case where the vibrator 101 is formed of a resin material, a resin material having a flexural modulus of 3.0 GPa or more is suitable. The shape and size of the vibrator 101 are not particularly limited. As shown in FIG. 2 and FIG. 3, one main surface of the vibrator 101 is a first main surface 101a and a main surface on the side opposite to the first main surface 101a is a second main surface. Recessions and projections described below are formed on the first main surface 101a.

The piezoelectric actuator 102 is joined to a second main surface 101b of the vibrator 101 and generates a vibration. The piezoelectric actuator 102 includes a positive electrode, a negative electrode, and a piezoelectric material layer, and when a voltage is applied between the positive electrode and the negative electrode, the piezoelectric material layer is deformed due to the reverse piezoelectric effect, so that a vibration is generated. In FIG. 1, a positive electrode terminal 102a connected to the positive electrode and a negative electrode terminal 102b connected to the negative electrode are shown.

A positive electrode wiring 104 is connected to the positive electrode terminal 102*a*, and a negative electrode wiring 105 is connected to the negative electrode terminal 102*b*. As shown in FIG. 1, the positive electrode wiring 104 and the negative electrode wiring 105 are connected to the drive device 103, and when a drive signal is supplied from the drive device 103, a vibration is generated in the piezoelectric actuator 102.

The piezoelectric actuator 102 may have a stacked structure in which a positive electrode and a negative electrode are alternately stacked with a piezoelectric material layer interposed therebetween, or may have another structure. The piezoelectric actuator 102 can be joined to the second main surface 101*b* with an epoxy resin or the like. Further, two or more piezoelectric actuators 102 may be joined to the second main surface.

As shown in FIG. 3, in the vibration generating device 100, a finger F of a user is used in contact with the first main surface 101*a*. At this time, the piezoelectric actuator 102 joined to the second main surface 101*b* generates a vibration, thereby causing the user to feel a haptic sensation with the finger F.

The drive device 103 includes, for example, an amplifier, is connected to the piezoelectric actuator 102 via the positive electrode wiring 104 and the negative electrode wiring 105, and supplies a drive signal to the piezoelectric actuator 102. Although the frequency of the drive signal is not particularly limited, 60 kHz or more is suitable.

[Regarding Vibrator]

Figure 4:
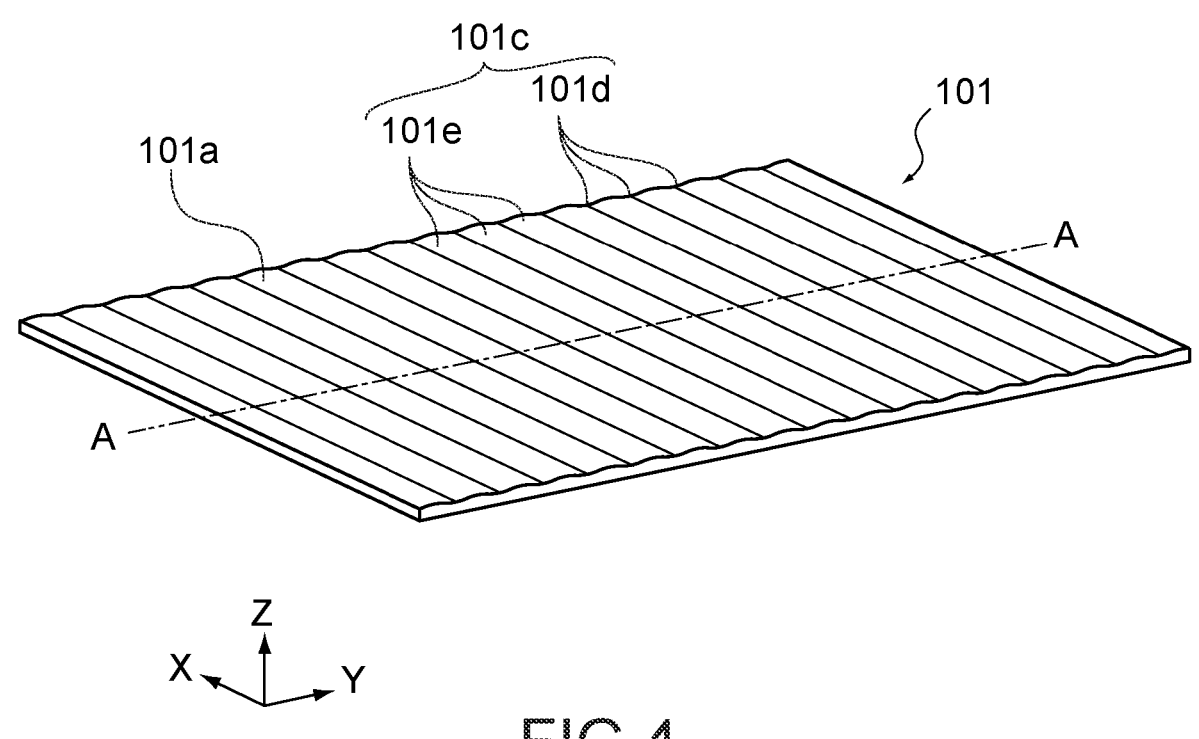
FIG. 4 is a perspective view of a vibrator included in the vibration generating device.
Figure 5:
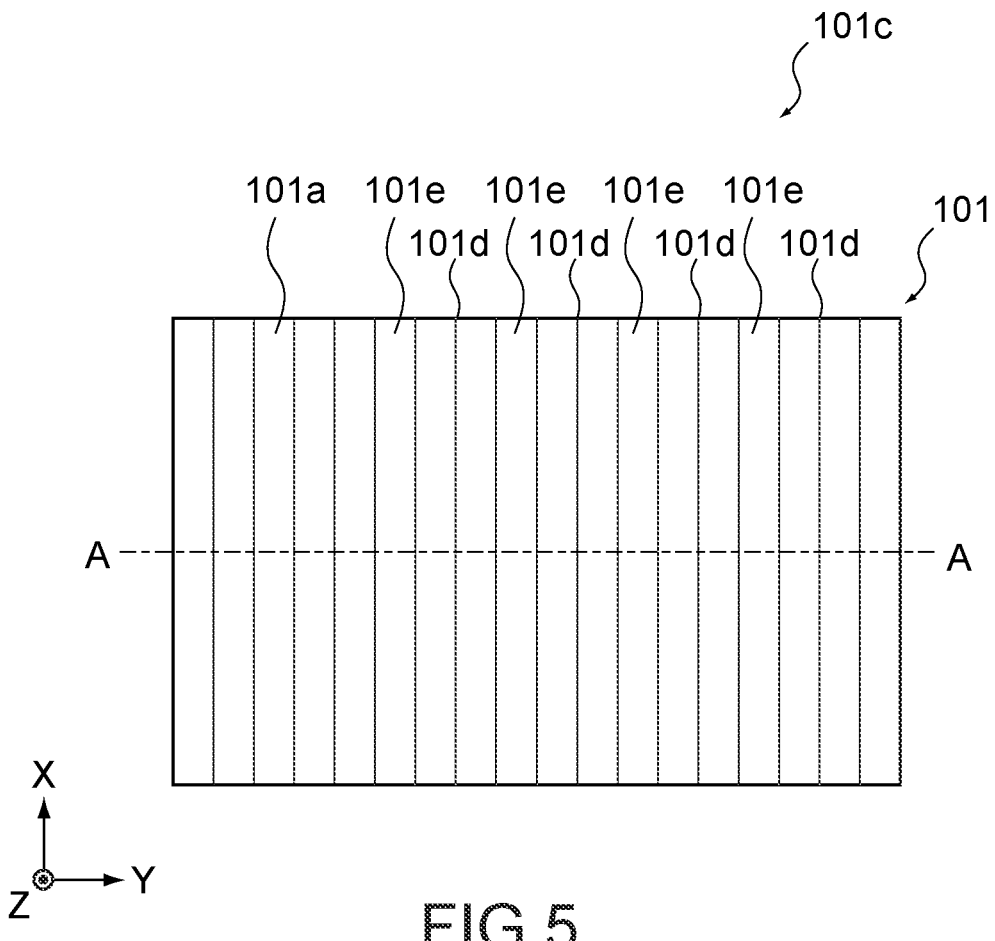
FIG. 5 is a plan view of the vibrator.
Figure 6:
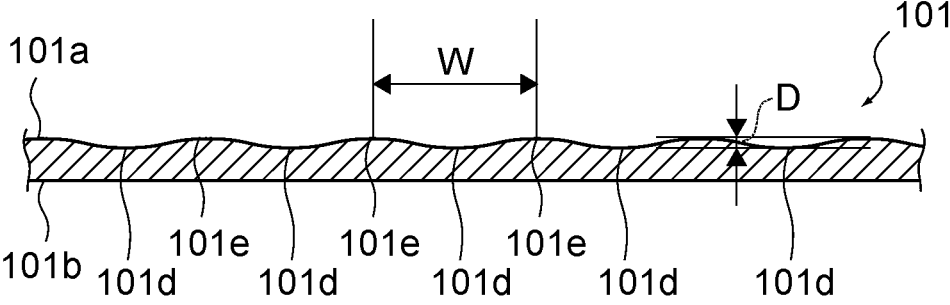
FIG. 6 is a side view of the vibrator.
Figure 6:
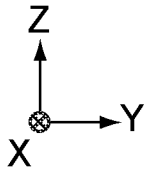

Regular recessions and projections are formed on the first main surface 101*a* of the vibrator 101. FIG. 4 is a perspective view of the vibrator 101 and is a diagram showing recessions and projections 101*c* formed on the first main surface 101*a*. Note that illustration of the recessions and projections 101*c* is omitted in FIG. 1 to FIG. 3. FIG. 5 is a plan view showing the first main surface 101*a*. FIG. 6 is a cross-sectional view of the vibrator 101 and is a cross-sectional view taken along the line A-A shown in FIG. 4 and FIG. 5.

As shown in these figures, a plurality of recessed portions 101*d* and a plurality of projecting portions 101*e* are provided on the first main surface 101*a*. Each of the recessed portions 101*d* extends in one direction (X direction) parallel to the first main surface 101*a* as viewed from a direction (Z direction) perpendicular to the first main surface 101*a*, and each of the projecting portions 101*e* extends in the direction (X direction) in which the recessed portions 101*d* extend.

The plurality of recessed portions 101*d* and the plurality of projecting portions 101*e* are alternately provided on the first main surface 101*a*, thereby forming the recessions and projections 101*c*. As shown in FIG. 6, the recessions and projections 101*c* can have a cross-sectional shape of a sine-wave shape in a plane (Y-Z plane) perpendicular to the extending direction of the recessed portions 101*d* and the projecting portions 101*e*.

The intervals between the recessed portions 101*d* and the projecting portions 101*e* are equal over the entire recessions and projections, and a width W is suitable 1 mm or more and 10 mm or less, the width W being a distance between peaks of the projecting portions 101*e* in a direction (Y direction) perpendicular to the extending direction (X direction) of the recessed portions 101*d* and the projecting portions 101*e* as shown in FIG. 6. Further, a depth D is suitably 0.01 mm or more and 0.1 mm or less, the depth D being a height difference between the recessed portions 101*d* and the projecting portions 101*e* in the thickness direction (Z direction) of the vibrator 101. Note that in FIG. 4 and FIG. 6, the depth direction (Z direction) of the recessions and projections 101*c* is magnified 10 times for convenience of illustration.

Figure 7:
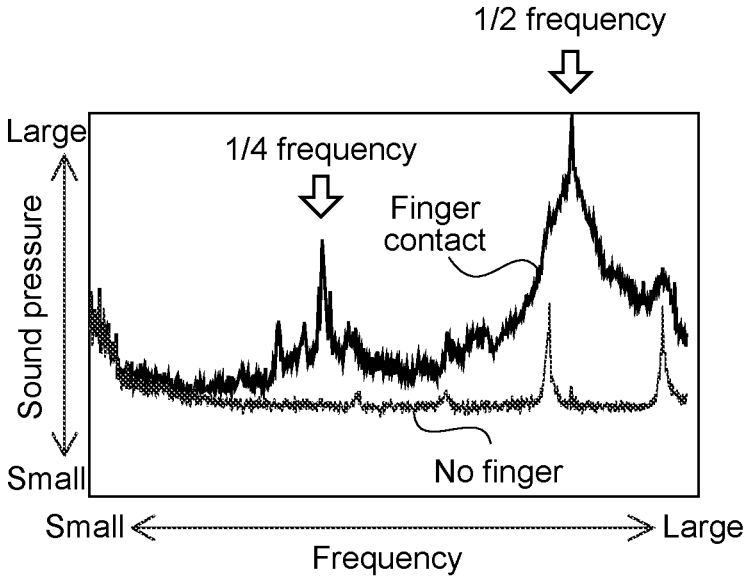
FIG. 7 is a graph showing the sound pressure characteristics of a vibrator according to a Comparative Example.

By forming the recessions and projections 101*c* on the first main surface 101*a* that the finger F of a user touches as described above, it is possible to suppress an abnormal sound (contact sound) generated between the finger F and the first main surface 101*a*. FIG. 7 is a graph showing the sound pressure characteristics of a vibrator in which recessions and projections are not provided as a comparison, and FIG. 8 is a graph showing the vibration displacement amount of the vibrator in the case where a finger has come into contact with this vibrator.

Figure 8:
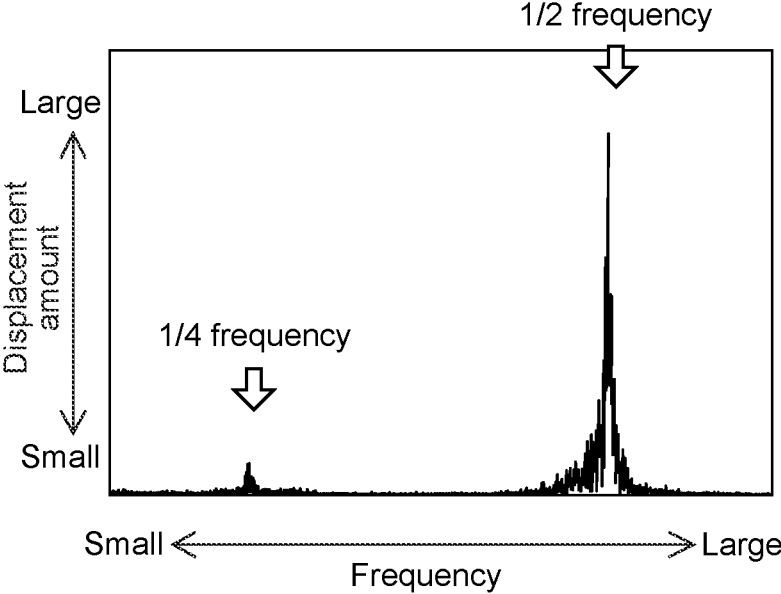
FIG. 8 a graph showing the vibration displacement amount of the vibrator according to the Comparative Example.

As shown in FIG. 7 and FIG. 8, when a finger has come into contact with the vibrator, it is heard as a contact sound because there are vibration peaks at frequencies of ½ and ¼ of the input frequency to a piezoelectric actuator and the peak of the ¼ frequency is in the audible range.

Figure 9:
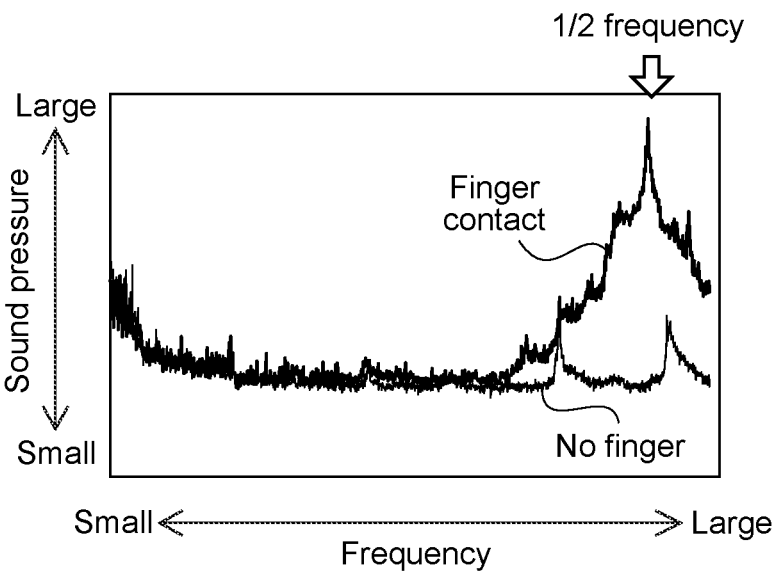
FIG. 9 is a graph showing the sound pressure characteristics of the vibrator included in the vibration generating device according to the embodiment of the present invention.
Figure 10:
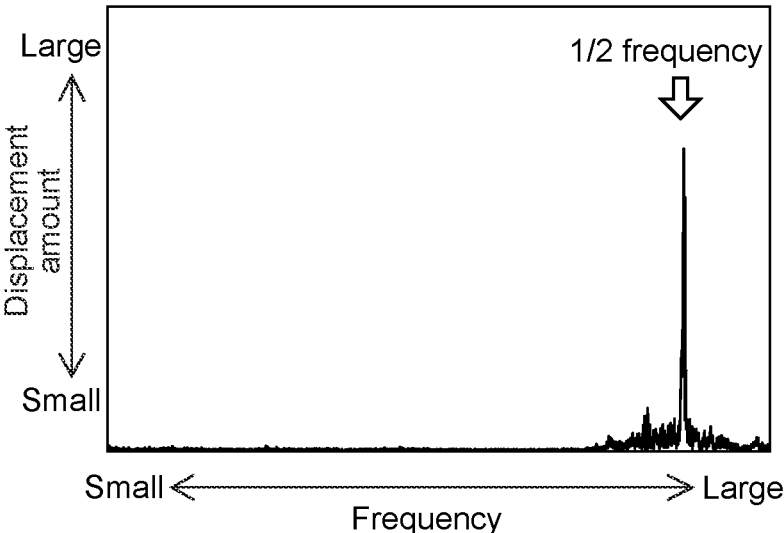
FIG. 10 is a graph showing the vibration displacement amount of the vibrator.

Meanwhile, FIG. 9 is a graph showing the sound pressure characteristics of a vibrator 101 in which the recessions and projections 101*c* are provided according to this embodiment, and FIG. 10 is a graph showing the vibration displacement amount of the vibrator in the case where the finger F has come into contact with this vibrator. As shown in FIG. 9 and FIG. 10, in the vibrator 101, it is possible to eliminate the peak of the ¼ frequency and reduce the contact sound. This is because the contact between the finger F touching the first main surface 101*a* and the first main surface 101*a* does not continue due to the provision of the recessions and projections 101*c*.

Further, in the vibrator 101, the recessed portions 101*d* and the projecting portions 101*e* are provided at regular intervals as described above, and in the case where the vibrator 101 has optical transparency, the recessions and projections 101*c* can be formed without impairing the optical transparency of the vibrator 101. For example, in the case of making the surface of the vibrator rougher, the vibrator becomes frosted glass and it is difficult to maintain the optical transparency. However, in the vibrator 101, it is possible to maintain the optical transparency.

Here, the width W is suitably 1 mm or more and 10 mm or less as described above. This is because the visibility via the vibrator 101 is reduced when the width W is less than 1 mm, and there is a possibility that the recessions and projections 101*c* do not come into contact with the finger F when the width W exceeds 10 mm. Further, the depth D is suitably 0.01 mm or more and 0.1 mm or less. This is because the effects of providing the recessions and projections 101*c* cannot be achieved when the depth D is less than 0.01 mm, and the recessions and projections 101*c* affect the haptic sensation even during non-vibration when the depth D exceeds 0.1 mm.

Figures 11, 12:
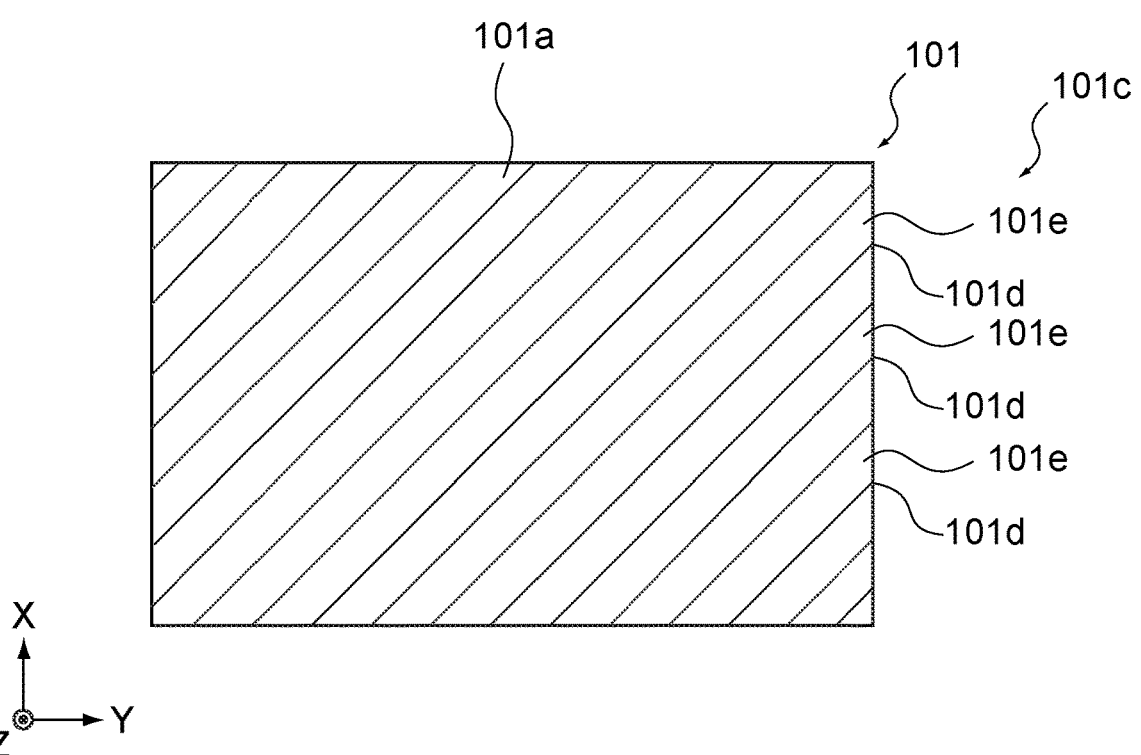
FIG. 11 is a plan view of the vibrator having another configuration according to the embodiment of the present invention.
FIG. 12 is a plan view of the vibrator having another configuration according to the embodiment of the present invention.

Note that although the recessed portions 101*d* and the projecting portions 101*e* are provided parallel to the lateral direction (X direction) of the vibrator 101 in the above description, the present invention is not limited thereto. FIG. 11 and FIG. 12 are each a plan view showing another configuration of the recessions and projections 101*c*. As shown in FIG. 11, the recessed portions 101*d* and the projecting portions 101*e* may be provided parallel to the longitudinal direction (Y direction) of the vibrator 101. Further, as shown in FIG. 12, the recessed portions 101*d* and the projecting portions 101*e* do not necessarily need to be provided parallel to the lateral direction (X direction) and the longitudinal direction (Y direction) of the vibrator 101 and may extend in an oblique direction.

Further, the recessions and projections 101c do not necessarily need to have a cross-sectional shape of a sine-wave shape. FIG. 13 to FIG. 15 are each a cross-sectional view showing another configuration of the recessions and projections 101c. As shown in FIG. 13, the recessions and projections 101c may have a cross-sectional shape of a square-wave shape in a plane (Y-Z plane) perpendicular to the extending direction of the recessed portions 101d and the projecting portions 101e.

Further, as shown in FIG. 14, the recessions and projections 101c may have a cross-sectional shape of a triangular-wave shape in a plane (Y-Z plane) perpendicular to the extending direction of the recessed portions 101d and the projecting portions 101e. Further, as shown in FIG. 15, the recessions and projections 101c may be formed by grooves extending in one direction. Note that the cross-sectional shape of the groove is not limited to the triangular shape as shown in FIG. 15 and may be a square shape, a semicircular shape, or the like.

Further, the recessions and projections 101c may include the recessed portions 101d and the projecting portions 101e that extend in two directions. FIG. 16 is a perspective view of the vibrator 101 in which the recessed portions 101d and the projecting portions 101e extend in two directions, and FIG. 17 is a plan view showing the first main surface 101a. The cross-sectional view taken along the line B-B shown in FIG. 16 and FIG. 17 is the same as that in FIG. 6.

As shown in FIG. 16 and FIG. 17, the plurality of recessed portions 101d and the plurality of projecting portions 101e are provided on the first main surface 101a. The respective recessed portions 101d extend along two directions (the X direction and the Y direction) parallel to the first main surface 101a as viewed from the direction (Z direction) perpendicular to the first main surface 101a, and the respective projecting portions 101e extend along the directions (the X direction and the Y direction) in which the recessed portions 101d extend.

In the first main surface 101a, the plurality of recessed portions 101d and the plurality of projecting portions 101e are alternately formed, thereby forming the recessions and projections 101c. As shown in FIG. 6, the recessions and projections 101c may have a cross-sectional shape of a sine-wave shape in planes (the Y-Z plane and the X-Z plane) perpendicular to the extending direction of the recessed portions 101d and the projecting portions 101e.

The intervals between the recessed portions 101d and the projecting portions 101e are equal over the entire recessions and projections, and the width W that is the distance between the peaks of the projecting portions 101e in the Y direction is suitably 1 mm or more and 10 mm or less as shown in FIG. 6. Further, the width W that is the distance between the peaks of the projecting portions 101e in also the X direction is suitably 1 mm or more and 10 mm or less. This is because the visibility via the vibrator 101 is reduced when the width W is less than 1 mm, and there is a possibility that the finger F does not come into contact with the recessions and projections 101c when the width W exceeds 10 mm.

Further, the depth D that is a height difference between the recessed portions 101d and the projecting portions 101e in the thickness direction (Z direction) of the vibrator 101 is suitably 0.01 mm or more and 0.1 mm or less. This is because the effects of providing the recessions and projections 101c cannot be achieved when the depth D is less than 0.01 mm, and the recessions and projections 101c affect the haptic sensation even during non-vibration when the depth D exceeds 0.1 mm. Note that in FIG. 16, the depth direction (Z direction) of the recessions and projections 101c is magnified 10 times for convenience of illustration.

By forming the recessions and projections 101c in which the recessed portions 101d and the projecting portions 101e extend along two directions (the X direction and the Y direction) parallel to the first main surface 101a as described above, it is possible to further suppress an abnormal sound (contact sound) generated between the finger F and the first main surface 101a.

By providing the recessions and projections 101c in two directions in the vibrator 101, it is possible to eliminate the peak of the ¼ frequency (see FIG. 9 and FIG. 10) and reduce the contact sound, similarly to the case of providing the recessions and projections 101c in one direction. Further, in the vibrator 101, the recessed portions 101d and the projecting portions 101e are provided at regular intervals as described above, and in the case where the vibrator 101 has optical transparency, the recessions and projections 101c can be formed without impairing the optical transparency of the vibrator 101.

Note that although the recessed portions 101d and the projecting portions 101e are provided parallel to the lateral direction (X direction) and the longitudinal direction (Y direction) of the vibrator 101 in the above description, the present invention is not limited thereto. FIG. 18 and FIG. 19 are each a plan view showing another configuration of the recessions and projections 101c. As shown in FIG. 18, the recessed portions 101d and the projecting portions 101e do not necessarily need to be provided parallel to the lateral direction (X direction) and the longitudinal direction (Y direction) of the vibrator 101 and may extend in an oblique direction. Further, as shown in FIG. 19, the two directions in which the recessed portions 101d and the projecting portions 101e extend do not necessarily need to be orthogonal to each other.

Further, also the cross-sectional shape of the recessions and projections 101c is not limited to a sine-wave shape and may be a square-wave shape or a triangular-wave shape as shown in FIG. 13 and FIG. 14, and the recessions and projections 101c may include grooves as shown in FIG. 15. Also the cross-sectional shape of the groove is not limited to the triangular shape as shown in FIG. 15 and may be a square shape, a semicircular shape, or the like.

Further, although the vibrator 101 is formed of glass or a resin material and provided with the recessions and projections 101c, the present invention is not limited thereto. For example, the vibrator 101 may be formed of glass or a resin material having a flexural modulus of 3.0 GPa or more and may be obtained by attaching a film 3 in which the recessions and projections 101c has been provided to a base material 2 having a smooth surface (as shown in FIG. 16).

[Regarding Drive Signal]

In the vibration generating device 100, it is also possible to prevent a contact sound from being generated by a drive signal supplied to the piezoelectric actuator 102. In the following configuration, the first main surface 101a of the vibrator 101 may be flat or include a plurality of recessions and projections formed at equal intervals as described above.

FIG. 20 is a graph showing the sound pressure characteristics of the vibrator 101 in the case where the finger F has come into contact with the vibrator 101 and in the case where the finger F is not in contact with the vibrator 101. As shown in the figure, when the finger F has come into contact with the vibrator 101, there are vibration peaks at frequencies of ½ and ¼ of the frequency of the drive signal and the peak of the ¼ frequency is heard as a contact sound.

FIG. 21 is a graph showing the vibration displacement amount of the vibrator 101 in the case where the finger F has come into contact with the vibrator 101. Similarly to the sound pressure characteristics, in the vibration of the vibrator 101, there are peaks at ½ and ¼ of the frequency of a drive signal and the vibrator 101 vibrates at the frequency when a finger has come into contact with the vibrator 101.

Here, when the drive device 103 generates a drive signal of 60 kHz or more as described above, the vibration of a ¼ frequency generated in the vibrator 101 is 15 kHz or more. Since the vibration of 15 kHz or more is out of the audible range of humans, a contact sound is inaudible.

As described above, in the vibration generating device 100, the drive device 103 supplies a drive vibration of 60 kHz or more to a piezoelectric actuator, thereby making it possible to present a haptic sensation to a user while preventing a contact sound from being generated.

The vibration generating device 100 has the configuration as described above. The vibration generating device 100 can be mounted on various electronic apparatuses such as a smartphone and a haptic function device.

REFERENCE SIGNS LIST 100 vibration generating device
101 vibrator
101*a* first main surface
101*b* second main surface
101*c* recessions and projections
101*d* recessed portion
101*e* projecting portion
102 piezoelectric actuator
103 drive device
The invention claimed is:

1. A vibration generating device, comprising:
a vibrator that has a first main surface and a second main surface on a side opposite to the first main surface; and
a piezoelectric actuator joined to the second main surface, wherein
a plurality of recessions and projections is formed at equal intervals on the first main surface,
the plurality of recessions and projections are constituted by recessed portions and projecting portions, and
the recessed portions extend in a first direction parallel to the first main surface, the projecting portions extend in the first direction, and the recessed portions and the projecting portions are formed alternately in a second direction parallel to the first main surface and perpendicular to the first direction.

2. The vibration generating device according to claim 1, wherein
the plurality of recessions and projections has a depth of 0.01 mm or more and 0.1 mm or less and a width of 1 mm or more and 10 mm or less.

3. The vibration generating device according to claim 1, wherein
the plurality of recessions and projections has a cross-sectional shape of a sine-wave shape on a plane perpendicular to the first direction.

4. The vibration generating device according to claim 1, wherein
the vibrator is formed of glass or a resin material having a flexural modulus of 3.0 GPa or more.

5. The vibration generating device according to claim 1, wherein the vibrator includes a base material and a film attached to a surface of the base material, and
the recessions and projections are formed on a surface of the film.

6. The vibration generating device according to claim 4, wherein
the vibrator has optical transparency.

7. An electronic apparatus, comprising:
a vibration generating device that includes
a vibrator that has a first main surface and a second main surface on a side opposite to the first main surface, and
a piezoelectric actuator joined to the second main surface, wherein
a plurality of recessions and projections is formed at equal intervals on the first main surface,
the plurality of recessions and projections are constituted by recessed portions and projecting portions, and
the recessed portions extend in a first direction parallel to the first main surface, the projecting portions extend in the first direction, and the recessed portions and the projecting portions are formed alternately in a second direction parallel to the first main surface and perpendicular to the first direction.

8. A vibration generating device, comprising:
a vibrator that has a first main surface and a second main surface on a side opposite to the first main surface;
a piezoelectric actuator that is joined to the second main surface; and
a drive device that supplies a drive signal of a frequency of 60 kHz or more to the piezoelectric actuator,
wherein the vibrator is a plate-shaped member wherein sound pressure characteristics of the vibrator has a peak of sound pressure at ¼ of a frequency of the drive signal in use when a user's finger touches the first main surface of the vibrator, and has another peak of sound pressure at a frequency higher than ¼ of the frequency of the drive signal in use when the user's finger does not touch the first main surface of the vibrator.

9. The vibration generating device according to claim 8, wherein
the vibrator is formed of glass or a resin material having a flexural modulus of 3.0 GPa or less.

10. An electronic apparatus, comprising:
a vibration generating device that includes a vibrator that has a first main surface and a second main surface on a side opposite to the first main surface, a piezoelectric actuator that is joined to the second main surface, and a drive device that supplies a drive signal of a frequency of 60 kHz or more to the piezoelectric actuator, wherein the vibrator is a plate-shaped member wherein sound pressure characteristics of the vibrator has a peak of sound pressure at ¼ of a frequency of the drive signal in use when a user's finger touches the first main surface of the vibrator, and has another peak of sound pressure at a frequency higher than ¼ of the frequency of the drive signal in use when the user's finger does not touch the first main surface of the vibrator.

11. The vibration generating device according to claim 1, further comprising
a drive device that supplies a drive signal of a frequency of 60 kHz or more to the piezoelectric actuator.

* * * * *